United States Patent [19]

Kohara

[11] Patent Number: 4,937,656
[45] Date of Patent: Jun. 26, 1990

[54] SEMICONDUCTOR DEVICE

[75] Inventor: Masanobu Kohara, Itami, Japan

[73] Assignee: Mitsubishi Denki Kabushiki Kaisha, Japan

[21] Appl. No.: 273,557

[22] Filed: Nov. 21, 1988

[30] Foreign Application Priority Data

Apr. 22, 1988 [JP] Japan .................................. 63-100514
Jun. 28, 1988 [JP] Japan .................................. 63-158066

[51] Int. Cl.⁵ ............................................. H01L 23/48
[52] U.S. Cl. ......................................... 357/70; 357/68;
 357/72
[58] Field of Search ............................. 357/68, 70, 72

[56] References Cited

U.S. PATENT DOCUMENTS 4,595,945 6/1986 Graver ................................... 357/68

FOREIGN PATENT DOCUMENTS 53-63979 7/1978 Japan .
61-7746 3/1986 Japan .
0258458 11/1986 Japan ................................... 357/72
62-134944 6/1987 Japan .

OTHER PUBLICATIONS

William Strauss et al., "Electronic Packaging Strategies for the 80s" by Integrated Circuit Engineering Corp. pp. 1B-7–1B-10 and 3F-9–3F24.

Primary Examiner—James W. Davie
Attorney, Agent, or Firm—Leydig, Voit & Mayer

[57] ABSTRACT

A semiconductor device provided with a semiconductor chip having first and second surface facing in the opposite directions, electrodes on the first surface; a plurality of leads disposed parallel with each other along the second surface of the semiconductor chip and each having opposite ends respectively extending outward from opposite sides of the second surface; a wire electrically connecting one end of each lead and one of the electrodes of the semiconductor chip; a resin enclosing the semiconductor chip, the ends of the leads connected to the electrodes, and the wires. The leads extend across the second surface of the semiconductor chip so that a relatively long length each lead embedded in the resin and the wire bonding portions of the leads are located in the vicinity of the sides of the semiconductor chip, thereby improving the releability of the device and the ease of to wire bonding.

11 Claims, 6 Drawing Sheets

SEMICONDUCTOR DEVICE

BACKGROUND OF THE INVENTION

1. Field of the Invention

This invention relates to a semiconductor device molded in a resin and, more particularly, to a semiconductor device having an improved lead structure.

2. Description of the Related Art

A conventional semiconductor device such as the one shown in FIG. 1 is known. The device shown in FIG. 1 is formed of a semiconductor chip 1, a lead frame 2, thin metallic wires 3, and a mold resin 4. The semiconductor chip 1 has first and second surfaces 12 and 13 which are rectangular and which face in opposite directions. The lead frame 2 is formed from a metallic foil made of a Fe-Ni alloy, phosphor bronze or the like, and has a die pad 21 and a plurality of leads 22 disposed around the die pad 21. The second surface 13 of the semiconductor chip 1 is fixed on the die pad 21. Each of electrodes 11 formed on the first surface 12 of the semiconductor chip 1 is electrically connected by the thin metal wire 3 made of Au, Al or the like to an end of the corresponding lead 22 which serves as a wire bonding portion 23. As shown in FIG. 2, the semiconductor chip 1, the die pad 21, the thin metallic wires 3 and portions of the leads 22 are molded in the mold resin 4 which is, for example, an epoxy resin.

This type of semiconductor device is manufactured as described below.

As shown in FIG. 3B, the second surface 13 of the semiconductor chip 1 is first fixed by an adhesive or solder on the die pad 21 of the lead frame 2 punched to form the die pad 21 and the plurality of leads 22 as shown in FIG. 3A. Next, each of the electrodes 11 formed on the first surface 12 of the semiconductor chip 1 is electrically connected to the wire bonding portion 23 of the corresponding lead 22 by means of the thin metallic wire 3. Thereafter, the semiconductor chip 1, the die pad 21, the thin metallic wires 3 and inner lead portions 25 of the leads 22 are molded in the mold resin 4, as shown in FIG. 3C, so that these components are protected from the outside air. Next, the outer lead portions 26 of the leads 22 exposed outside the mold resin 4 are bent so that they have suitable profiles, and die pad supporting portions 24 which support the die pad 21 are cut.

Recently, the outside dimensions of molded semiconductor devices have had to be reduced, while the semiconductor chip 1 typically a dynamic RAM molded in the mold resin 4, has an increased size.

In the lead frame 2 used in the conventional semiconductor device, however, the wire bonding portion 23 formed at the inner end of each lead 22 is positioned in the vicinity of the peripheral portion of the die pad 21, as shown in FIG. 3A. Therefore, the length L of the inner lead portion 25 embedded in the mold resin 4 as shown in FIG. 2 must be reduced. A reduction in the length L of the embedded inner lead portion 25 may cause a considerable concentration of stress at the boundary between the wire bonding portion 23 of the lead 22 and the mold resin 4 when the outer lead portion 26 is bent and may reduce the strength of adhesion between the wire bonding portion 23 and the mold resin 4, thereby increasing the possibility of water entering the semiconductor device through the interface between the lead 22 and the mold resin 4. In consequence, this type of semiconductor device is lacks good reliability.

SUMMARY OF THE INVENTION

In view of these problems, it is an object of the present invention to provide a semiconductor device improved in the strength of adhesion at the interface between each lead and the mold resin and, hence, improved in reliability even for a large size semiconductor chip.

To this end, the present invention provides a semiconductor device including a semiconductor chip having first and second surfaces facing in opposite directions, electrodes being formed on the first surface; at least one lead disposed along the second surface of the semiconductor chip and having opposite ends respectively extended outward from a pair of opposite sides of the second surface; a thin metallic wire electrically connecting one end of the lead and one of the electrodes of the semiconductor chip; and a mold resin molding the semiconductor chip, the end of the lead connected to the electrode, and the thin metallic wire while exposing the other end of the lead.

In accordance with the present invention, the lead extends across the second surface of the semiconductor chip, one end of the lead is electrically connected to one of the electrodes of the semiconductor chip, and the other end of the lead is exposed as an outer lead portion outside the mold resin.

DETAILED DESCRIPTION OF THE PREFERRED EMBODIMENTS

Embodiments of the present invention will be described below with reference to the accompanying drawings.

Figure 1:
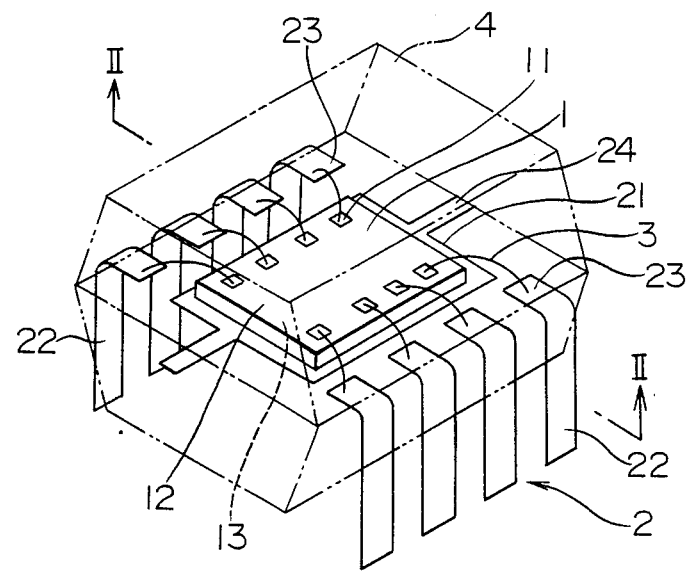
FIG. 1 is a perspective view of a conventional semiconductor device.
Figure 2:
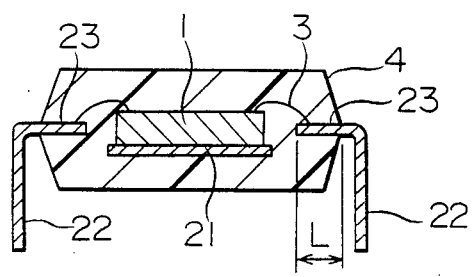
FIG. 2 is a cross-sectional view taken along the line II—II of FIG. 1.
Figure 3A:
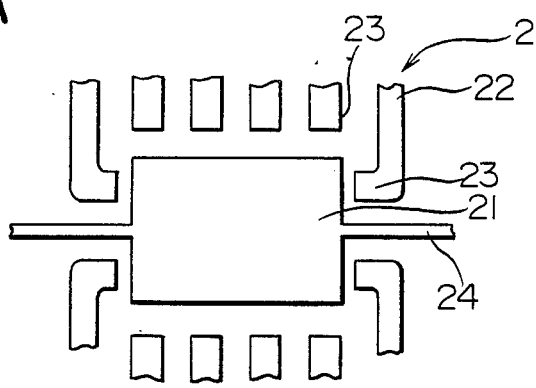
FIGS. 3A to 3C are plan views successively illustrating steps of a method of manufacturing the conventional semiconductor device.
Figure 3B:
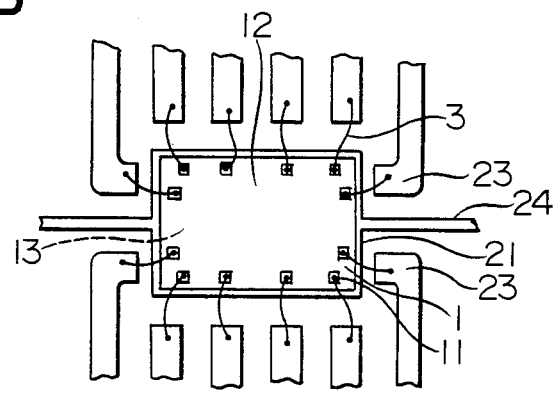
Figure 3C:
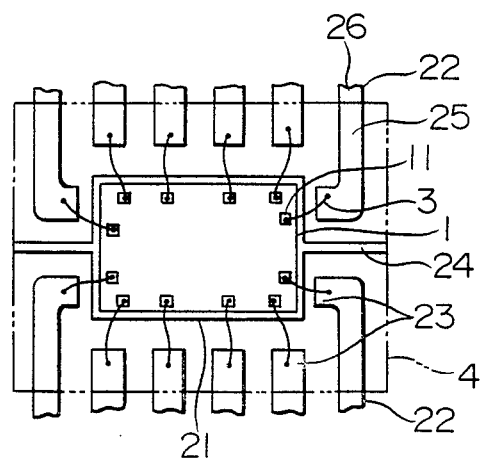
Figure 4:
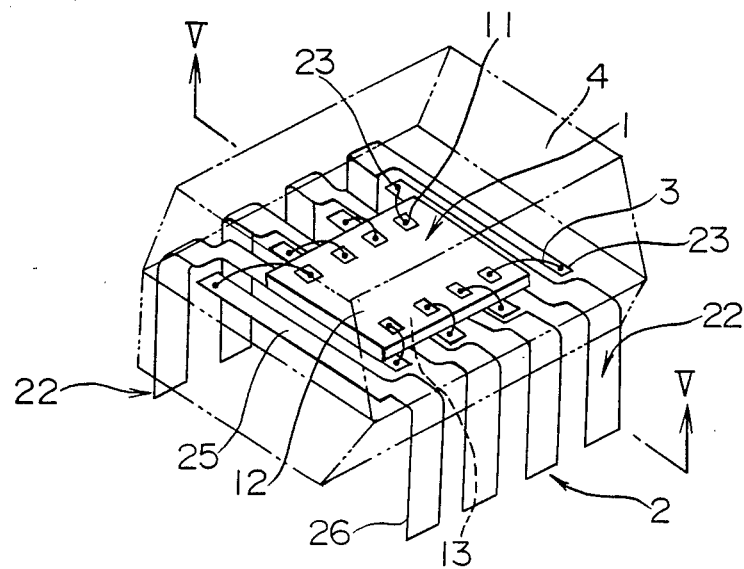
FIG. 4 is a perspective view of a semiconductor device which represents an embodiment of the present invention.

FIG. 4 shows in a perspective view a semiconductor device which represents an embodiment of the present invention. The semiconductor device shown in FIG. 4 is formed of a semiconductor chip 1, a lead frame 2, thin metallic wires 3, and a mold resin 4. The semiconductor chip 1 has first and second surfaces 12 and 13 which are rectangular and which face in opposite directions. A plurality of electrodes 11 are formed on the first surface 12.

The lead frame 2 is formed from a metallic foil made of a Fe-Ni alloy, phosphor bronze or the like and has a plurality of leads 22 generally parallel to each other.

Each of the leads 22 comprises an inner lead portion 25 embedded in the mold resin 4 and an outer lead portion 26, exposed outside the mold resin 4 as an electrical terminal. The inner lead portions 25 are adjacently disposed parallel to each other, while the outer lead portions 26 are connected to the inner lead portions 25, extending alternately in opposite directions. The semiconductor chip 1 is fixed on the inner lead portions 25 of the leads 22. The extreme end of the inner lead portion 25 of each lead 22 outwardly extends beyond one of the longer sides of the second surface 13 of the semiconductor chip 1 so that it forms a wire bonding portion 23. The other end of the inner lead portion 25 extends beyond the other longer side of the second surface 13 of the semiconductor chip 1 and is connected to the outer lead portion 26.

Figure 5:
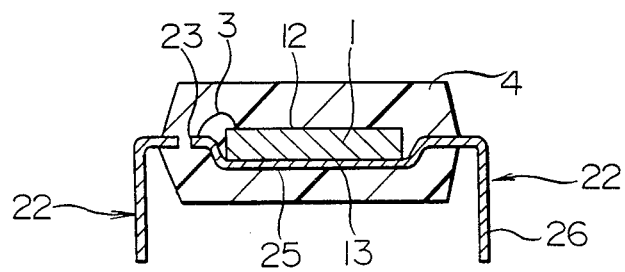
FIG. 5 is a cross-sectional view taken along the line V—V of FIG. 4.

The wire bonding portion 23 of each lead 22 is electrically connected to the corresponding electrode 11 of the semiconductor chip 1 by the thin metallic wire 3 made of Au, Al or the like. As shown in FIG. 5, the semiconductor chip 1, the inner lead portions 25 and the metallic wires 3 are embedded in the mold resin 4 which is, for example, epoxy resin.

A method of manufacturing the thus-constructed semiconductor device will now be described below.

Figure 6A:
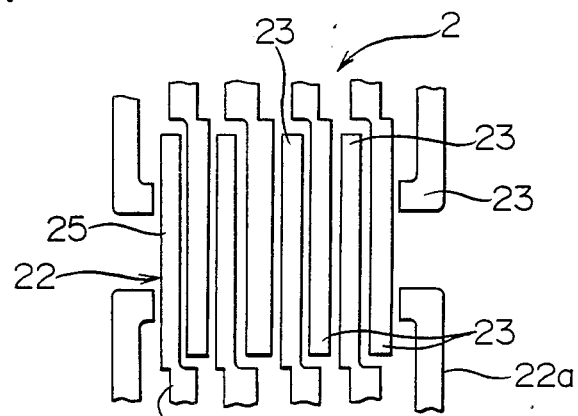
FIGS. 6A to 6C are plan views successively illustrating steps of a method of manufacturing the semiconductor device shown in FIG. 4.
Figure 6B:
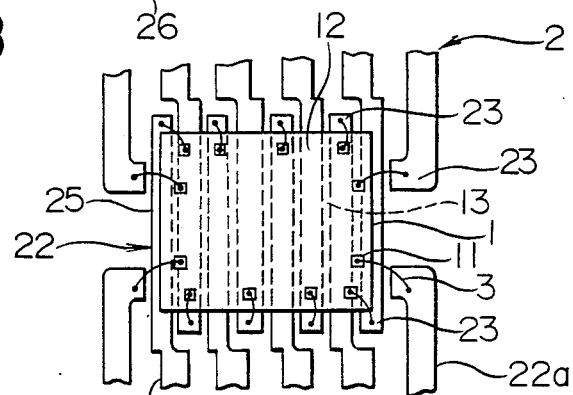

As shown in FIG. 6B, the second surface 13 of the semiconductor chip 1 is first mounting with an insulating adhesive on the inner lead portions 25 of the lead frame 2 which is punched to form the plurality of parallel leads 22 as shown in FIG. 6A. Next, each of the electrodes 11 formed on the first surface 12 of the semiconductor chip 1 and the wire bonding portion 23 of the corresponding lead 22 are electrically connected to each other by means of the thin metallic wire 3.

Figure 6C:
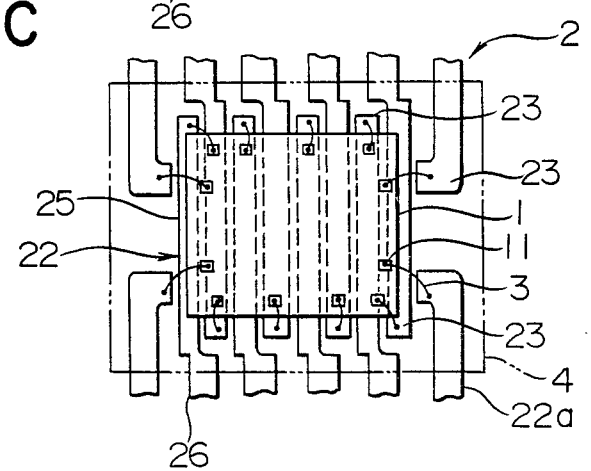

Thereafter, the semiconductor chip 1, the inner lead portions 25 and the thin metallic wires 3 are molded in the mold resin 4, as shown in FIG. 6C, so that these components are protected from the outside air. The outer lead portions 26 exposed outside the mold resin 4 are bent so that they have suitable profiles.

In the thus-manufactured semiconductor device, the length of the portion of each lead 22 embedded in the mold resin 4 is large and the strength of adhesion between the lead 22 and the mold resin 4 is high, reducing the possibility of the occurrence of a gap or crack at the interface between the lead 22 and the mold resin 4 when the outer lead portion 26 is bent. Since, in each lead 22, the distance between the outer lead portion 26 and the wire bonding portion 23 is so large that, the influence of water entering the mold resin 4 along the lead 22 is small and the resistance to moisture is improved.

Each lead 22 extends across the pair of longer sides of the semiconductor chip 1 and the wire bonding portion 23 of the lead 22 is positioned in the vicinity of the corresponding longer side of the semiconductor chip 1. Therefore, the possibility of short circuits between adjacent leads 22 is limited even in a case where the size of the semiconductor chip 1 and the number of leads 22 are large. The workability relating to wire bonding is thereby improved.

The example of the semiconductor device illustrated in FIGS. 6A to 6C also has leads 22a which are positioned facing the shorter sides of the semiconductor chip 1 without overlapping the semiconductor chip 1. This type of lead may be provided as desired. It is easy to increase the length of the portion embedded in the mold resin 4 since the position of each lead 22a deviates from the longer side of the semiconductor chip 1.

Figure 7:
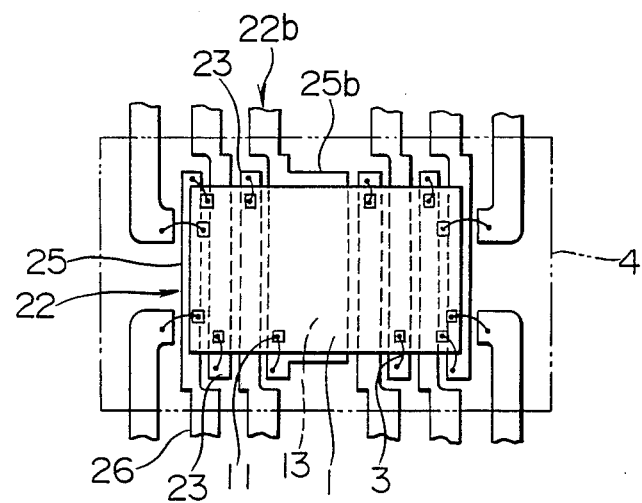
FIGS. 7 to 9 are plan views of other embodiments of the present invention.

To mount a different type of semiconductor chip 1 having an electrode formed on the second surface 13 in addition to those formed on the first surface 12, the area of an inner lead portion 25b of a lead 22b is increased, and the electrode formed on the second surface 13 of the semiconductor chip 1 is electrically connected to the inner lead portions 25b by soldering or the like, as shown in FIG. 7.

If the electrode is formed over the second surface 13 of the semiconductor chip 1, it is necessary to electrically insulate this electrode from the leads 22 of the other electrodes by providing an insulating film or the like. If a plurality of electrodes are formed on the second surface 13 of the semiconductor chip 1, a corresponding number of leads 22b having inner lead portions 25b of increased areas may be provided.

Figure 8:
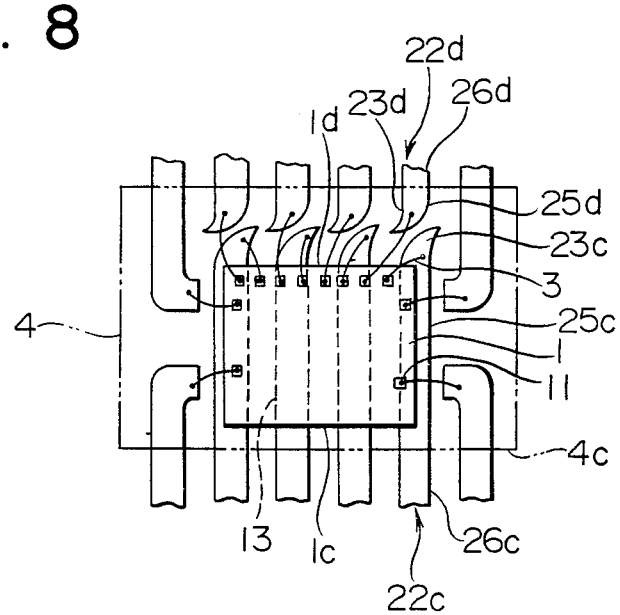

FIG. 8 shows another embodiment of the present invention.

In the semiconductor device shown in FIG. 8, only leads 22c, which have outer lead portions 26c outwardly extending away from one side 1c of a pair of longer sides of the semiconductor chip 1, transversely extend over the second surface 13 of the semiconductor chip 1. The leads 22c are provided with wire bonding portions 23c which are positioned in the vicinity of the other longer side 1d. Inner lead portions 25d of leads 22d whose outer lead portions 26d are outwardly extended away from the other longer side 1d of the semiconductor chip 1 are provided with wire bonding portions 23d which are positioned in the vicinity of the longer side 1d without overlapping the semiconductor chip 1. Since, in this case, there are no wire bonding portions 23c and 23d on the side of the longer side 1c of the semiconductor chip 1, the semiconductor chip 1 is not necessarily aligned with the center axis of the mold resin body 4 and it can be disposed in such a manner that it is shifted toward a side 4c of the mold resin body 4 over which the outer lead portions 26c are extended outward. It is thereby possible to increase the length of the embedded inner lead portion 25d of each lead 22d that does not extend across the semiconductor chip 1.

Figure 9:
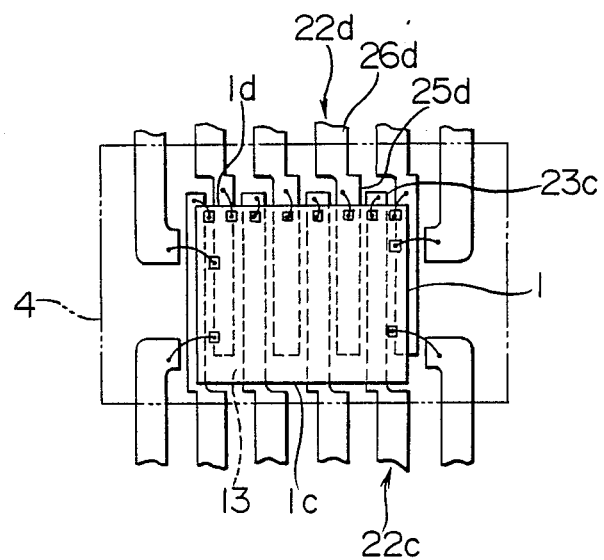

The arrangement may be such that, as shown in FIG. 9, the extreme ends of the inner lead portions 25d of the leads 22d whose outer lead portions 26d are outwardly extended away from the longer side 1d of the semiconductor chip 1 are extended toward the longer side 1c so that they are positioned below the second surface 13 of the semiconductor chip 1. This arrangement makes it possible to further increase the length of the embedded inner lead portion 25d.

In another possible arrangement, the inner lead portion 25 of each lead 22 disposed below the second surface 13 of the semiconductor chip 1 is bent generally at right angles so that the extreme end of the inner lead portion 25 extends over one of the shorter sides of the semiconductor chip 1 and serves as the wire bonding portion 23. However, in this case, the wire bonding portions 23 of the multiplicity of leads 22 are concentrated at the shorter sides of the semiconductor chip 1. This arrangement is therefore disadvantageous to a semiconductor device having a large number of leads 22 although it is suitable for a semiconductor device having a comparatively small number of leads 22.

Figure 10:
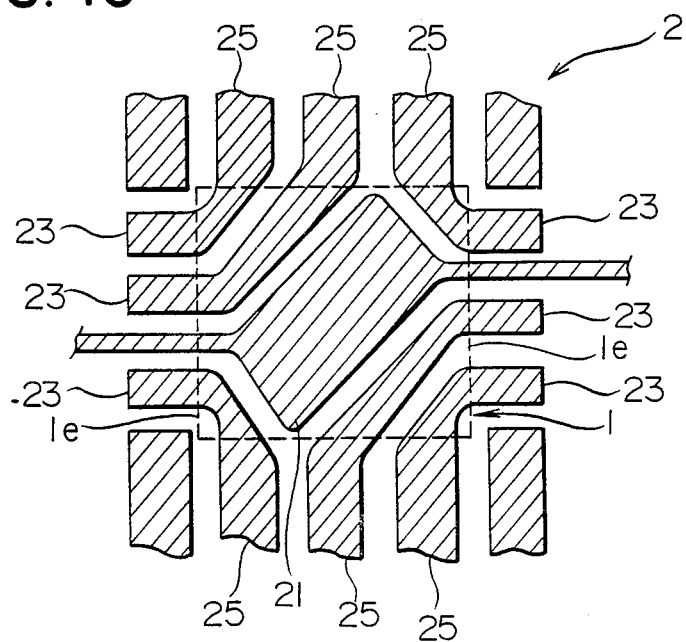
FIG. 10 is a plan view of a lead frame according to another embodiment of the present invention.

The die pad for mounting the semiconductor chip 1 is not necessarily removed completely. Instead, a die pad 21, such as the one shown in FIG. 10, which is smaller than the semiconductor chip 1, may be provided. Inner leads 25 are disposed around the periphery of the small die pad 21. When the semiconductor chip 1 is fixed on the die pad 21, the inner leads 25 around the periphery of the die pad 21 are positioned below the semiconductor chip 1. In the example shown in FIG. 10, each inner lead 25 is angled below the semiconductor chip 1 and the wire bonding portion 23 is extended outward from a shorter side 1e of the semiconductor chip 1. The semiconductor chip 1 can be fixed on the lead frame 2 more securely by being fixed to this type of die pad 21 although the size thereof is small.

The illustrated semiconductor devices exemplifying in the above-described embodiments are of the DIP (dual in-line package) type. However, the present invention is not limited to this package configuration and it can be applied to other various types of semiconductor devices.

WHAT IS CLAIMED IS:

1. A semiconductor device comprising:
   a semiconductor chip having opposed first and second surfaces and opposed first and second sides and including a plurality of electrodes disposed on said first surface;
   at least three first leads disposed generally parallel to each other opposite and along said second surface of said semiconductor chip, each first lead including opposed first and second ends respectively extending outwardly from said first and second sides of said semiconductor chip, each of said first ends forming a terminal of said device;
   wires electrically connecting respective ones of said second ends of said first leads with corresponding electrodes on said semiconductor chip; and
   a resin encapsulating said semiconductor chip, said second ends of said plurality of first leads, and said wires, said first and second ends of said first leads extending alternately from said first and second sides of said semiconductor chip.

2. The semiconductor device according to claim 1 wherein said second surface of said semiconductor chip is rectangular and said first and second sides are the longer sides of said second surface.

3. The semiconductor device according to claim 1 comprising at least one second lead having a first end spaced from and opposed to said semiconductor chip and electrically connected to one of said electrodes and a second end extending from said resin, said at least one second lead not crossing said semiconductor chip.

4. The semiconductor device according to claim 1 comprising a second electrode disposed on said second surface of said semiconductor chip and electrically connected to one of said first leads.

5. The semiconductor device according to claim 1 comprising a second electrode disposed on said second surface of said semiconductor chip and a third lead having opposed first and second ends extending from said resin at the first end of said third lead and along said second surface at the second end of said third lead opposite and electrically connected to said second electrode.

6. A semiconductor device comprising:
   a semiconductor chip having opposed first and second surfaces and opposed first and second sides and including a plurality of electrodes disposed on said first surface;
   at least three first leads disposed generally parallel to each other opposite and along said second surface of said semiconductor chip, each first lead including opposed first and second ends respectively extending outwardly from said first and second sides of said semiconductor chip, each of said first ends forming a terminal of said device;
   wires electrically connecting said second ends that are adjacent said first side of said semiconductor chip with corresponding electrodes on said semiconductor chip;
   wires electrically connecting said first leads, not having their respective second ends adjacent said first side to corresponding electrodes on said semiconductor chip adjacent said first side of said semiconductor chip; and
   a resin encapsulating said semiconductor chip, said second ends of said plurality of first leads, and said wires, said first and second ends of said first leads extending alternately from said first and second sides of said semiconductor chip whereby said semiconductor chip may be offset toward said second side within said resin.

7. The semiconductor device according to claim 6 wherein said second surface of said semiconductor chip is rectangular and said first and second sides are the longer sides of said second surface.

8. The semiconductor device according to claim 6 comprising at least one second lead having a first end spaced from and opposed to said semiconductor chip and electrically connected to one of said electrodes and a second end extending from said resin, said at least one second lead not crossing said semiconductor chip.

9. A semiconductor device comprising:
   a semiconductor chip having opposed first and second surfaces and opposed first and second sides and including a plurality of electrodes disposed on said first surface;
   at least three first leads disposed generally parallel to each other opposite and along said second surface of said semiconductor chip, each lead including opposed first and second ends respectively extending outwardly from said first and second sides of said semiconductor chip, each of said first ends forming a terminal of said device;
   a plurality of second leads, each second lead including opposed first and second ends, said first ends extending outwardly from said first side of said semiconductor chip and forming a terminal of said device, said second ends being disposed adjacent said first side of said semiconductor chip;
   wires electrically connecting respective ones of said second ends of said first leads adjacent said first side of said semiconductor chip with corresponding electrodes on said semiconductor chip;
   wires electrically connecting respective ones of said second ends of said second leads adjacent said first side of said semiconductor chip with corresponding electrodes on said semiconductor chip; and
   a resin encapsulating said semiconductor chip, said second ends of said first and second leads, and said wires whereby said semiconductor chip may be offset toward said second side within said resin.

10. The semiconductor device according to claim 9 wherein said second surface of said semiconductor chip is rectangular and said first and second sides are the longer sides of said second surface.

11. The semiconductor device according to claim 9 comprising at least one second lead having a first end spaced from and opposed to said semiconductor chip and electrically connected to one of said electrodes and a second end extending from said resin, said at least one second lead not crossing said semiconductor chip.

* * * * *